(12) United States Patent
Deal et al.

(10) Patent No.: US 6,657,504 B1
(45) Date of Patent: Dec. 2, 2003

(54) SYSTEM AND METHOD OF DETERMINING RING OSCILLATOR SPEED

(75) Inventors: Gregory K. Deal, West Chester, PA (US); David S. Milowicki, Chadds Ford, PA (US); Chris E. Limson, Norristown, PA (US)

(73) Assignee: Unisys Corporation, Blue Bell, PA (US)

( * ) Notice: Subject to any disclaimer, the term of this patent is extended or adjusted under 35 U.S.C. 154(b) by 9 days.

(21) Appl. No.: 10/135,542

(22) Filed: Apr. 30, 2002

(51) Int. Cl.[7] ................ H03B 27/00; G01R 31/317
(52) U.S. Cl. ...................... 331/57; 324/763
(58) Field of Search .................. 331/57, 1 A, 74, 331/34; 324/763, 765, 73.1

(56) References Cited

U.S. PATENT DOCUMENTS

| | | | | |
|---|---|---|---|---|
| 4,697,140 A | * | 9/1987 | Saito et al. ................. 324/73.1 |
| 4,758,821 A | * | 7/1988 | Nelson et al. ............... 341/157 |
| 5,045,811 A | * | 9/1991 | Lewis ........................ 331/1 A |
| 5,087,842 A | * | 2/1992 | Pulsipher et al. ........... 327/270 |
| 5,097,208 A | * | 3/1992 | Chiang ....................... 324/537 |
| 5,099,196 A | * | 3/1992 | Longwell et al. ........... 324/537 |
| 5,331,294 A | * | 7/1994 | Watanabe et al. ............. 331/57 |
| 5,448,202 A | * | 9/1995 | Owen ......................... 329/323 |
| 5,457,400 A | * | 10/1995 | Ahmad et al. .............. 324/763 |
| 5,619,463 A | * | 4/1997 | Malhi ........................ 365/201 |
| 5,818,250 A | * | 10/1998 | Yeung et al. ............... 324/763 |

FOREIGN PATENT DOCUMENTS

JP          401084657 A   *  3/1989   ................. 324/765

* cited by examiner

*Primary Examiner*—Robert Pascal
*Assistant Examiner*—Joseph Chang
(74) *Attorney, Agent, or Firm*—Michael B. Atlass; Mark T. Starr; Ratner Prestia

(57) ABSTRACT

A system of determining oscillation frequency of a ring oscillator formed on a chip. The system includes a ring oscillator formed on the chip for providing a ring clock signal having first periodic pulses, and a ring counter formed on the chip for providing a ring clock count value in response to the first periodic pulses. The system also includes a terminal for receiving a system clock signal having second periodic pulses, and a system counter formed on the chip for providing a system clock count value in response to the second periodic pulses. The oscillation frequency of the ring oscillator is determined based on the ring clock count value and the system clock count value.

19 Claims, 7 Drawing Sheets

SYSTEM AND METHOD OF DETERMINING RING OSCILLATOR SPEED

TECHNICAL FIELD

The present invention relates, in general, to ring oscillators and, more specifically, to a system and method of determining speed of a ring oscillator located on an integrated circuit (IC), such as an application specific IC (ASIC).

BACKGROUND OF THE INVENTION

Ring oscillators are incorporated into IC designs to generate an oscillation frequency. Typically, more than one ring oscillator may be arranged on an ASIC. For example, a ring oscillator may be arranged at each corner of the dye. By measuring the oscillation frequency of the ring oscillator, the speed of the ASIC may be determined.

A ring oscillator, generally designated as 90, is shown in FIG. 9. As shown, ring oscillator 90 includes an odd number of inverting delay elements 92, 93 connected in series to form a closed loop with positive feedback. Assuming that each inverter includes the same signal propagation delay, the oscillation frequency of the ring oscillator is inversely proportional to the number of inverters in the loop (five in FIG. 9). The fewer the number of inverters in the loop, the higher the oscillation frequency of the output clock signal 94. Three inverters in the loop, however, is the minimum number required to maintain a self starting oscillation. By using ENABLE signal 91, logic inverter (NAND gate) 92 may be reset to allow a controlled start-up of oscillation.

Determining the speed of an ASIC is usually done by measuring the speed of a ring oscillator on the chip, since the speed of the ring oscillator is a good indication of the speed of the rest of the logic on the chip. Conventionally, the speed of the ring oscillator is measured by physically probing a pin on the chip. Probing a pin on the chip requires special fixtures and separate test equipment. For example, the chip is usually held by automated test equipment (ATE) which provides access to clock-output signal 94. A circuit analyzer in the ATE, which may be an oscilloscope, is used to determine the ring oscillator frequency.

A problem associated with the above approach is the limited use of pin resources. Often, in large-scale designs implemented in high-density ASIC devices, the number of pins available for use on the ASIC governs the amount of logic which may actually be placed within the device. Therefore, pin conservation is a primary concern. Using pins for outputting ring oscillator clock signals from the device is a disadvantage, because it reduces the amount of functional logic that may be placed within the device.

Another problem associated with the above approach is the cost involved in measuring the speed of the ring oscillator. Since the ring oscillator frequency is typically higher than the worst case speed (frequency) of the chip, the circuit analyzer in the ATE requires a faster frequency response than the chip under test. This results in increased cost. Furthermore, determining the speed of the ring oscillator is usually performed by human intervention. This further increases cost.

The problems associated with measuring speed of a ring oscillator show that a need still exists for an improved system and method of determining the oscillation frequency of the ring oscillator. This invention includes a solution to these problems.

SUMMARY OF THE INVENTION

To meet this and other needs, and in view of its purposes, the present invention provides a system of determining oscillation frequency of a ring oscillator formed on a chip. The system includes a ring oscillator formed on the chip for providing a ring clock signal having first periodic pulses, and a ring counter formed on the chip for providing a ring clock count value in response to the first periodic pulses. The system also includes a terminal for receiving a system clock signal having second periodic pulses, and a system counter formed on the chip for providing a system clock count value in response to the second periodic pulses. The oscillation frequency of the ring oscillator is determined based on the ring clock count value and the system clock count value.

In an embodiment of the invention, the system clock signal includes a predetermined frequency, and the oscillation frequency of the ring oscillator is determined based on a product of (a) the predetermined frequency and (b) a ratio formed by the ring clock count value and the system clock count value.

In another embodiment of the invention, the ring counter includes a first register for storing a first preset value, and the system counter includes a second register for storing a second preset value. The ring counter is configured to countdown from the first preset value in response to the first periodic pulses, and the system counter is configured to countdown from the second preset value in response to the second periodic pulses. The second register may be a N-bit register and the second preset value may be N-bits wide. The first register may be a (N+x)-bit register and the second preset value may be (N+x)-bits wide, where x may be an integer value of 1, 2 or 3.

In yet another embodiment of the invention, a maintenance test set may statically shift into the first register the first preset value and shift into the second register the second preset value. The first register may be configured to count down to a first ring clock count value, and the maintenance test set may be configured to statically shift out from the first register the first ring clock count value.

The invention also includes a method of determining oscillation frequency of the ring oscillator. The ring oscillator and the system clock are disabled. The ring oscillator is coupled to a ring counter and the system clock is coupled to a system counter. Next, the system clock is enabled. The ring oscillator and the system counter are enabled in response to enabling the system clock. The method counts, in the ring counter, pulses of the ring oscillator and counts, in the system counter, pulses of the system clock. The method determines the oscillation frequency of the ring oscillator in response to counting the pulses.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Preferred embodiments of this invention will now be described with reference to the figures. It should be appreciated that this invention is not limited to the exemplary embodiments selected for illustration in the figures. It should also be appreciated that variations and modifications to the exemplary embodiments may be made without departing from the spirit or scope of this invention.

Figure 1:
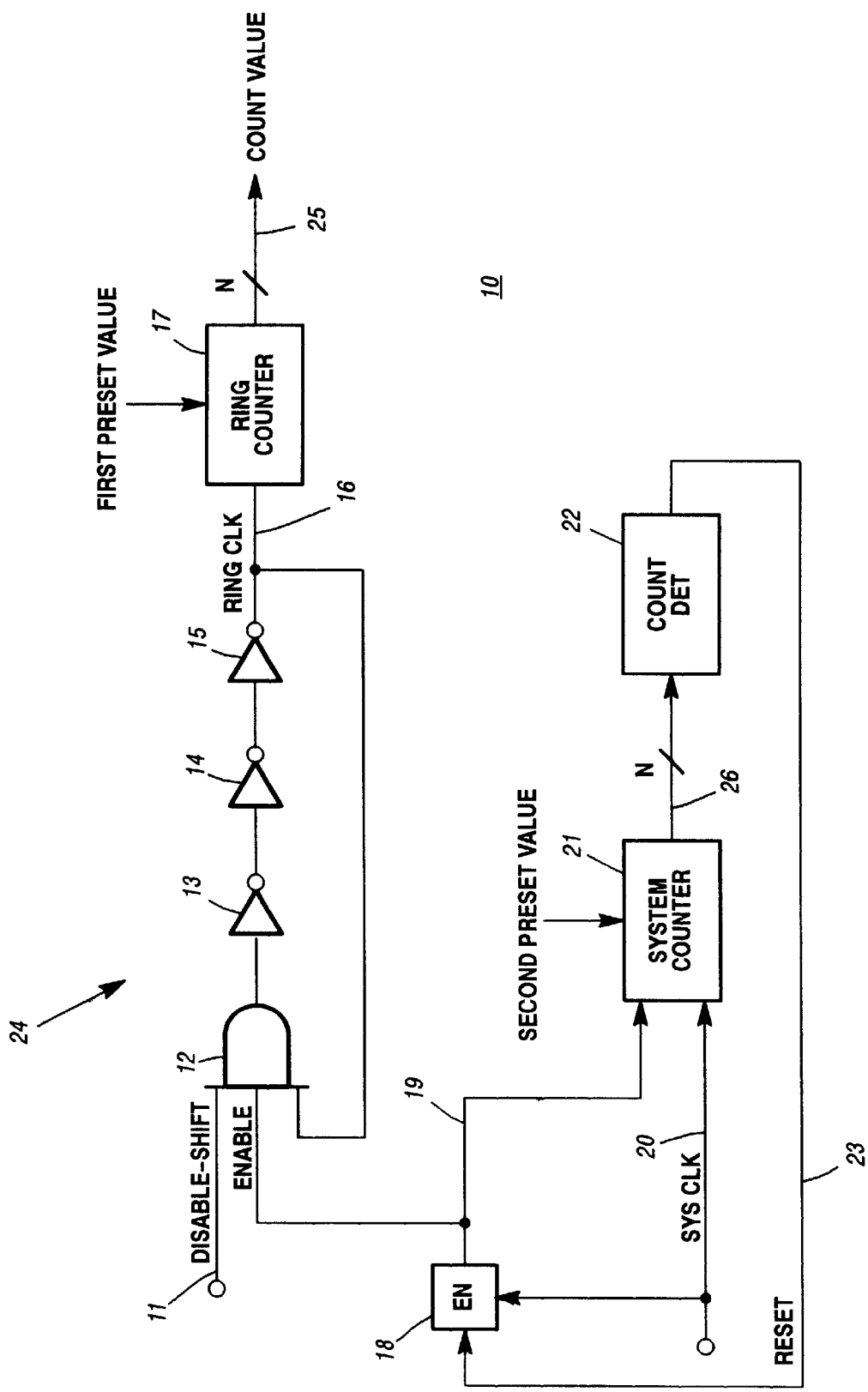
FIG. 1 is a system for measuring speed (frequency) of a ring oscillator in accordance with an exemplary embodiment of an aspect of the invention.

Referring to FIG. 1 there is shown a system, generally designated as 10, for determining speed (or frequency) of a ring oscillator. System 10 includes ring oscillator 24, ring counter 17, enable circuit 18, system counter 21 and count detector 22. Each is described below.

Ring oscillator 24 includes inverters 13, 14 and 15 connected in series to form a closed loop with positive feedback. Although three inverters are shown in FIG. 1, it will be appreciated that ring oscillator 24 may include a different odd-number of inverting elements. Ring oscillator 24 provides a ring clock (RCLK) signal as an oscillating output signal on line 16. The ring clock signal is fed back into AND-gate 12 to provide positive feedback for maintaining oscillation. Depending on signal propagation delays of AND-gate 12 and inverters 13–15, the ring clock signal includes an oscillation frequency that is inversely proportional to the number of inverters in the loop.

It will be appreciated that the oscillation frequency (speed) of ring oscillator 24 may also depend on ambient temperature, voltage and fabrication variations, stress and age of the elements in the loop. Depending on these factors, the ring clock signal may have an oscillation frequency (and a period) that varies from a maximum value to a minimum value. The ring clock signal on line 16 may be provided as an input signal to ring counter 17. As will be explained, ring counter 17 may be a decrement counter for providing a count down based on each period in the ring clock signal. Ring counter 17 may count down from a preset value, in response to each rising edge (for example) of a pulse in the ring clock signal.

Also included in ring oscillator 24 is AND-gate 12 which enables the ring oscillation. In the exemplary embodiment of FIG. 1, when the output value of AND-gate 12 is 1, the ring clock signal on line 16 continues to oscillate, thereby providing rising edge pulses for counting by ring counter 17.

The output value of AND-gate 12 is 1, of course, when the ring clock (RCLK) signal on line 12 is 1, the enable (EN) signal on line 19 is 1 and the disable-shift signal on line 11 is 1.

It will be appreciated that the disable-shift signal on line 11 may be provided by a maintenance test set (not shown) to prevent shifting test vectors or combinations of logic values, into the ASIC, during a time interval that system 10 is measuring the speed of ring oscillator 24. The disable-shift signal may also be provided to disable counting during a time interval between the end of shifting and the enable (EN) signal transitioning to a high (1) value (explained below).

Figure 2:
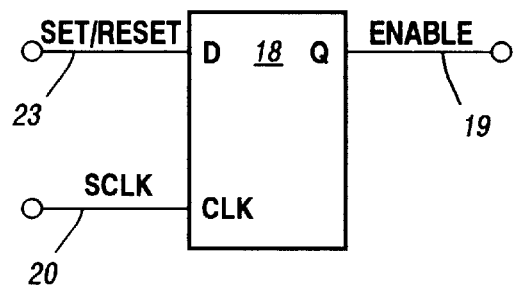
FIG. 2 is an exemplary embodiment of an enable circuit shown in FIG. 1 in accordance with an aspect of the invention.

The enable (EN) signal on line 19 is provided by enable circuit 18. In the exemplary embodiment of FIG. 1 when the enable signal is 1 (and the disable-shift signal on line 11 is 1) ring oscillator 24 is oscillating. When the enable signal is 0, on the other hand, ring oscillator 24 stops oscillating. Enable circuit 18 may be a D-type flip-flop as shown in FIG. 2. The set/reset signal on line 23, provided to the D-pin of EN flip-flop 18, appears as an enable (EN) signal at the Q-pin of the flip-flop, in response to clocking operation of the system clock (SCLK) on line 20. In operation, when the system clock transitions from a low value (0) to a high value (1) and the set/reset signal is a high value (1), the enable (EN) signal on line 19 transitions to a high value (1). When the system clock transitions from a low value to a high value and the set/reset signal is a low value, however, the enable signal transitions to a low value.

Returning to FIG. 1, the enable signal may also be provided to system counter 21 to enable the system counter to count each pulse of the system clock on line 20. As will be explained, system counter 21 may be a decrement counter and may count down from a preset value in response to, for example, each rising edge of the system clock. The count value from system counter 21 may be provided to count detector 22. Upon detecting a predetermined count value, for example, count value of 1 or 0 (preferably count value of 1), count detector 22 may provide a reset signal on line 23 to enable circuit 18. The reset signal may be clocked-out from enable circuit 18 onto line 19 by the next system clock, thereby causing the enable signal on line 19 to transition to a low (0) value. Transition of the enable signal to a low value concurrently stops ring oscillator 24 and system counter 21.

Figure 3:
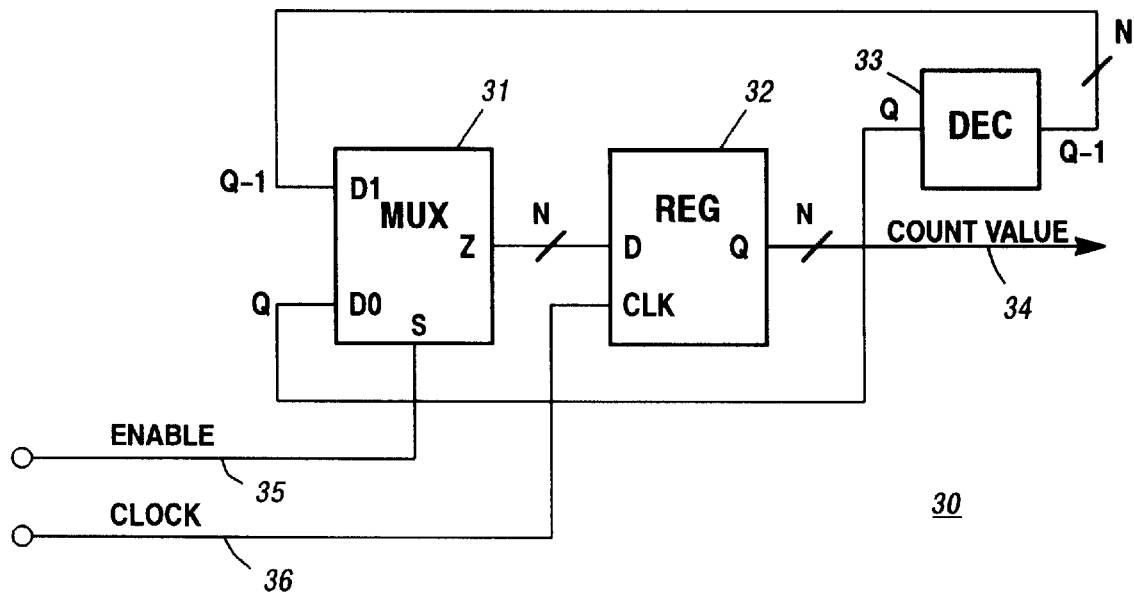
FIG. 3 is an exemplary embodiment of a counter shown in FIG. 1 in accordance with an aspect of the invention.

An exemplary embodiment of ring counter 17 and system counter 21 is illustrated in FIG. 3. In general, there is shown decrement counter 30 including multiplexer 31, register 32 and decrementer 33 connected in series. Register 32 is a N-bit register comprised of N number of D flip-flops (one shown). N-parallel bits of data are provided on the D-pins of the register and N-parallel bits of data are provided on the Q-pins of the register. The data is dynamically loaded into the register by clocking operation of the clock signal (system clock) on line 36. Loading may be in response to the clock signal transitioning from a low (0) value to a high (1) value. The data output from the Q-pins includes a value of N-parallel bits, designated as count value, on line 34.

Decrementer 33, as shown, receives the current count value from register 32 and decrements the count value by one (1). The output value (Q−1) is fed back to the D1-pin of multiplexer 31. The Z output data of multiplexer 31 is provided to the D-pins of register 32. On a next transition of the clock, register 32 presents this new data value on the Q-pins. Decrementer 33, in turn, decrements the data value by one (1), thus repeating the process. Multiplexer 31 provides output data values to register 32, when the enable signal on line 35 is a high (1) value (for example).

As explained below, decrement counter 30 includes a preset data value shifted into register 32. The preset data value is the starting count value from which decrement counter 30 begins the count down. The preset data value may be shifted into register 32 using static shifting via a maintenance test set. Static shifting may be used to load a known value into any or all flip-flops (for example) on a chip. Alternate sets of pins into the flip-flop may be used, such as shift clock (SHCLK), shift data in (SDI) and shift data out (SDO). The shift clock and shift data in pins of the flip-flop may be used during the static shifting mode. The clock (CLK) and D pins of the flip-flop may be used during the normal functional mode (static shifting mode disabled). The system clock at the CLK pin and the shift clock at the SHCLK pin may not be used at the same time, because the result may be indeterminate.

Figure 4:
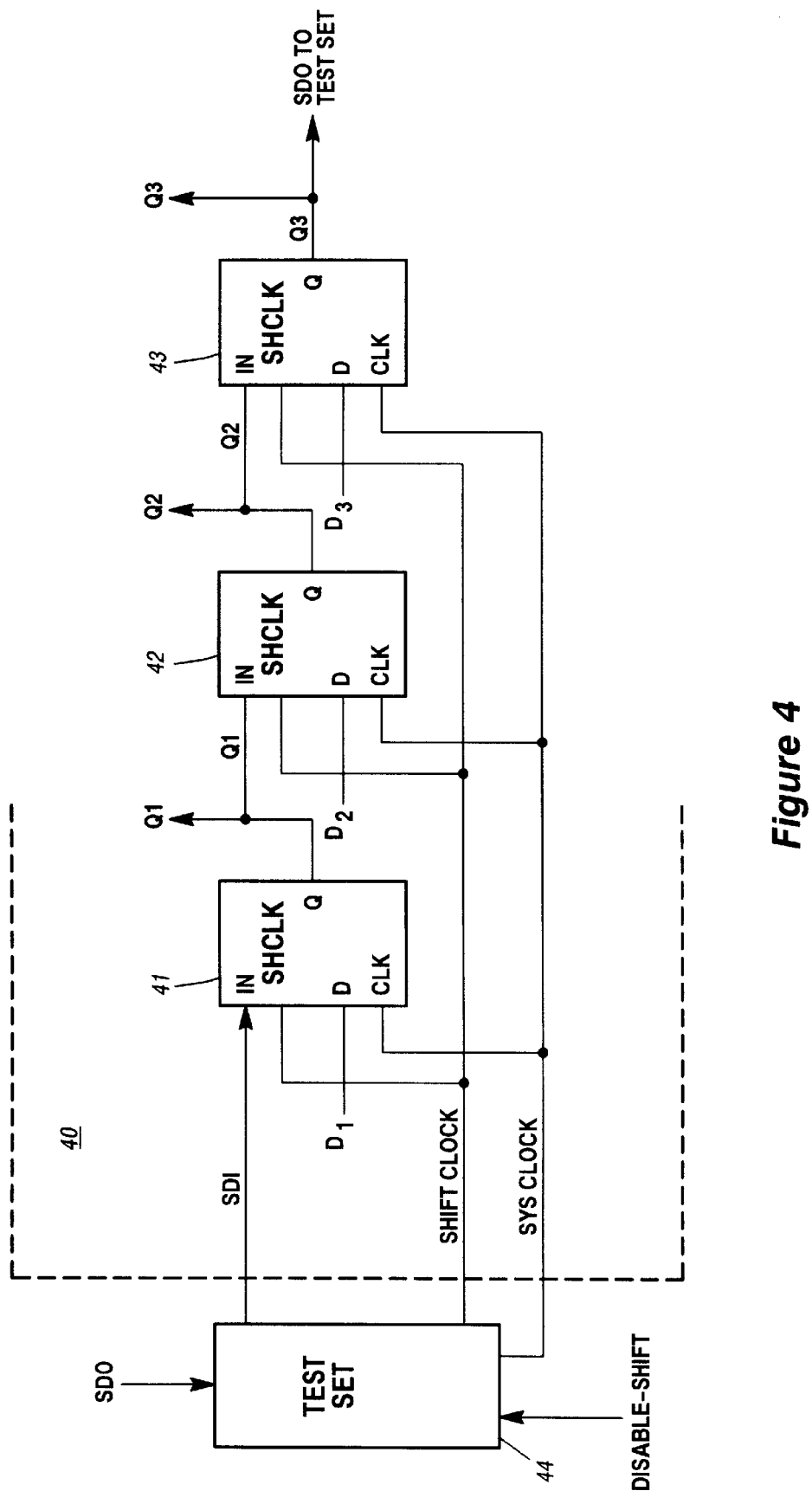
FIG. 4 is an exemplary embodiment of a register coupled to a maintenance test set for statically shifting in and shifting out a test vector value in accordance with an embodiment of the invention.

An example of register 40 including three D-flip-flops 41, 42 and 43 connected to maintenance test set 44 is shown in FIG. 4. It will be appreciated that although three flip-flops are shown in the figure, register 40 may include more than three flip-flops. Register 40, as shown, is a 3-bit register which receives three functional parallel data bits on lines $D_1$, $D_2$ and $D_3$, and outputs three functional parallel data bits on lines $Q_1$, $Q_2$ and $Q_3$. Clocking in data on lines $D_1$, $D_2$ and $D_3$ and clocking out data on lines $Q_1$, $Q_2$ and $Q_3$ is controlled by a system clock, as previously described (dynamic loading). The system clock may be a clock residing on the chip or a clock residing in the maintenance test set. When the system clock is operating, the shift clock is not operating.

In the static shifting mode, the system clock is turned-off. Maintenance test set 44 may then shift data into the register via the shift data in (SDI) line that is coupled to flip-flop 41, using the shift clock. In the example shown, three data values may be loaded into the three flip-flops, using the shift clock. Data may also be shifted out in the static shifting mode from the shift data out (SDO) line of flip-flop 43 using the same shift clock. It will be appreciated that the SDO line and the SDI line are at opposite ends of the shift chain and may be fed and received by maintenance test logic (not shown). As data is shifted out from these flip-flops, the data values may be read or recorded from the SDO line at the appropriate time.

It will also be appreciated that maintenance test set 44 may perform ASIC testing by shifting in an appropriate value (to test a particular area of logic on the chip), issue a test clock (via test logic control), and then shift out the new data value from the logic (flip-flops, for example). The new data value may be compared against an expected data value.

Returning to the description of FIG. 1, a first preset value may be shifted into ring counter 17 using the maintenance test set. The first preset value may be 2047, for example. It will be appreciated that an 11-bit counter (including a register having 11 flip-flops) has $2^{11}$ different values and may count down from 2047 (2048−1) to 0. In a similar manner, a second preset value may be shifted into system counter 21 using the maintenance test set. The second preset value may be 1023, for example. It will be appreciated that a 10-bit counter (including a register having 10 flip-flops) has $2^{10}$ different values and may count down from 1023 (1024−1) to 0.

The preset values and the bit size of each counter may be determined as follows. Ring counter 17 counts clocks (pulses) from ring oscillator 24 and system counter 21 counts clocks from the system clock. If both counters are concurrently enabled and if the ring oscillator period is close to the system clock period, then a similar number of ring counter clocks and system counter clocks may occur. In order to save on the amount of logic for making the ring oscillator, and since most chips are faster than a worst case chip specified by the manufacturer (perhaps 2 or 3 times faster), the period of the ring oscillator is made smaller than the period of the system clock. Therefore, if the system counter is made, for example, 10-bits wide (10-bit counter), then the ring counter may be made 12 or 13-bits wide (12 or 13-bit counter). In this manner, the ring counter may count down 2 or 3 times faster than the system counter, without the ring counter stopping prematurely at a 0 value.

In operation, after statically shifting a first preset value into ring counter 17 and a second preset value into system counter 21, the system clock on line 20 may be turned on. Enable circuit 18 may then be dynamically shifted by the system clock to provide the enable signal on line 19. In turn, ring oscillator 24 may begin to oscillate and provide the ring clock signal on line 16. Ring counter 17 may begin to count down from the first preset value. Concurrently, system counter 21 may begin to count down from the second preset value.

The count value output on line 26 (also, for example, the count value output on line 34 in FIG. 3) may be received by count detector 22, as shown in FIG. 1. Count detector 22 may be set to detect a count value of 1 on line 26. When detected, count detector 22 may provide a reset signal on line 23. The enable circuit may be reset by the reset signal on the next transition of the system clock. This may cause the ring oscillator to stop oscillating and the ring counter to stop counting. The count value on line 25 may be statically shifted out from the ring counter to the test maintenance set.

Figure 5:
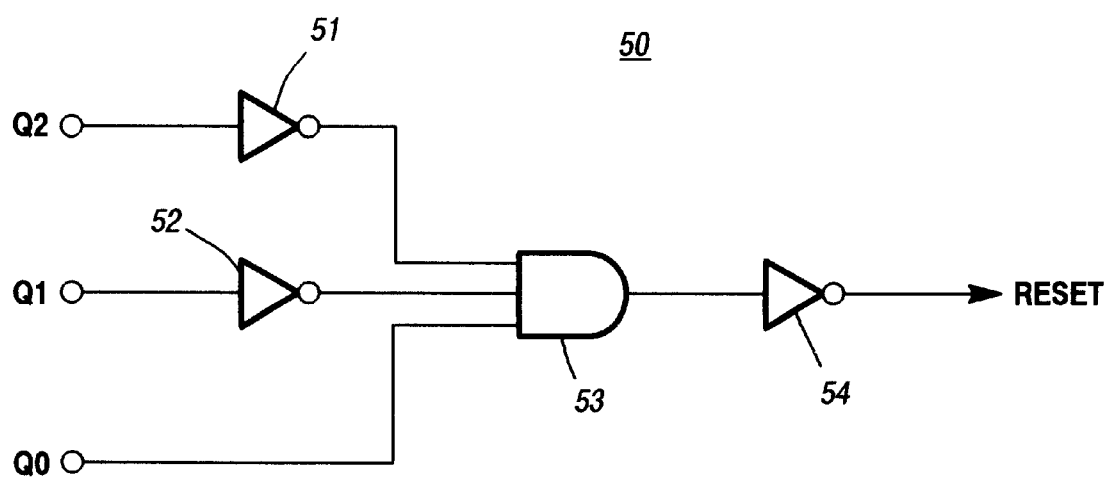
FIG. 5 is an exemplary embodiment of a count detector shown in FIG. 1 in accordance with an aspect of the invention.

An exemplary embodiment of count detector 22 is shown in FIG. 5. As shown, detector 50 detects a count value of 1 and provides the reset signal in response to the detection. For discussion purpose, detector 50 includes inverters 51, 52, 54 and AND-gate 53, configured as shown, and logically detects 3 bits ($Q_0$, $Q_1$ and $Q_2$ of a register) having a value of 1.

The operation of system 10 (FIG. 1) is further explained with reference to the timing diagram shown in FIG. 6. As shown, SCLK is the system clock signal on line 20. EN is the enable signal on line 19. RCLK is the ring clock signal on line 16. System counter (SYSCOUNT) 21 begins to count down from a preset value of 1023 (for illustration purpose assumed to be a 10-bit counter). Ring counter (RING COUNT) 17 begins to count down from a preset value of 2047 (for illustration purpose assumed to be an 11-bit counter).

Figure 6:
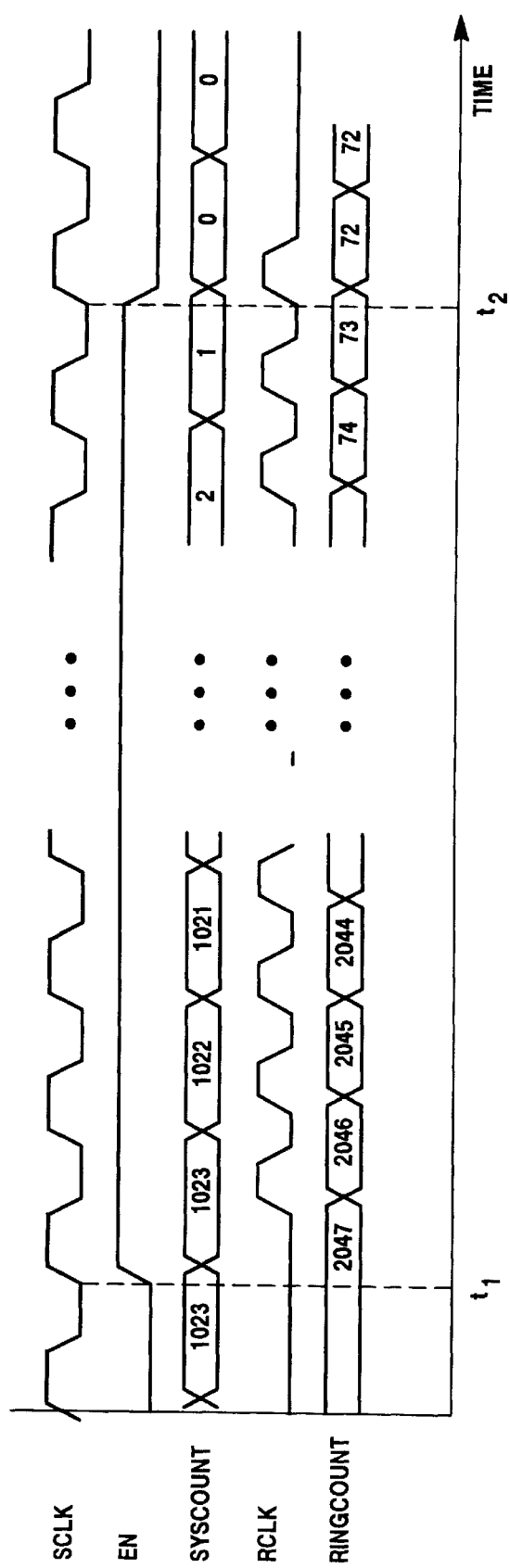
FIG. 6 is a timing diagram of relationships among various signals generated in the system shown in FIG. 1 in accordance with an aspect of the invention.

As shown in FIG. 6, at time $t_1$, SCLK causes EN to transition to a 1 value. SYSCOUNT, which is enabled by EN, begins a count down from 1023 in response to each positive transition of SCLK. EN transitioning to a 1 value also causes RCLK to be enabled. RINGCOUNT begins to count down from 2047 in response to each positive transition of RCLK.

At time $t_2$, the count detector detects a value of 1 from SYSCOUNT and resets EN (on the next clock of SCLK). In turn, RCLK stops oscillating and RINGCOUNT stops at a count of 72 (for example). The count value of 72 (for example) may be shifted out to the maintenance test set via line 25.

The ring oscillator speed may be determined from the following equation:

$$\text{ring osc. frequency} = \frac{\text{Ring Count down}}{\text{System Count down}} \times \text{system frequency}$$

In the example shown in FIG. 6, system frequency of SCLK is assumed to be 100 MHz (the value may be based on the worst case timing analysis of the chip). The ring oscillator frequency of RCLK may be computed from the above equation, as follows:

$$\text{RCLK frequency} = 100 \text{ MHz} \times \frac{2047 - 72}{1023} = 193 \text{ MHz}.$$

Thus, in the above example, the chip (on which system 10 resides) is running at approximately twice the speed that a worst case analysis predicts.

Figure 7:
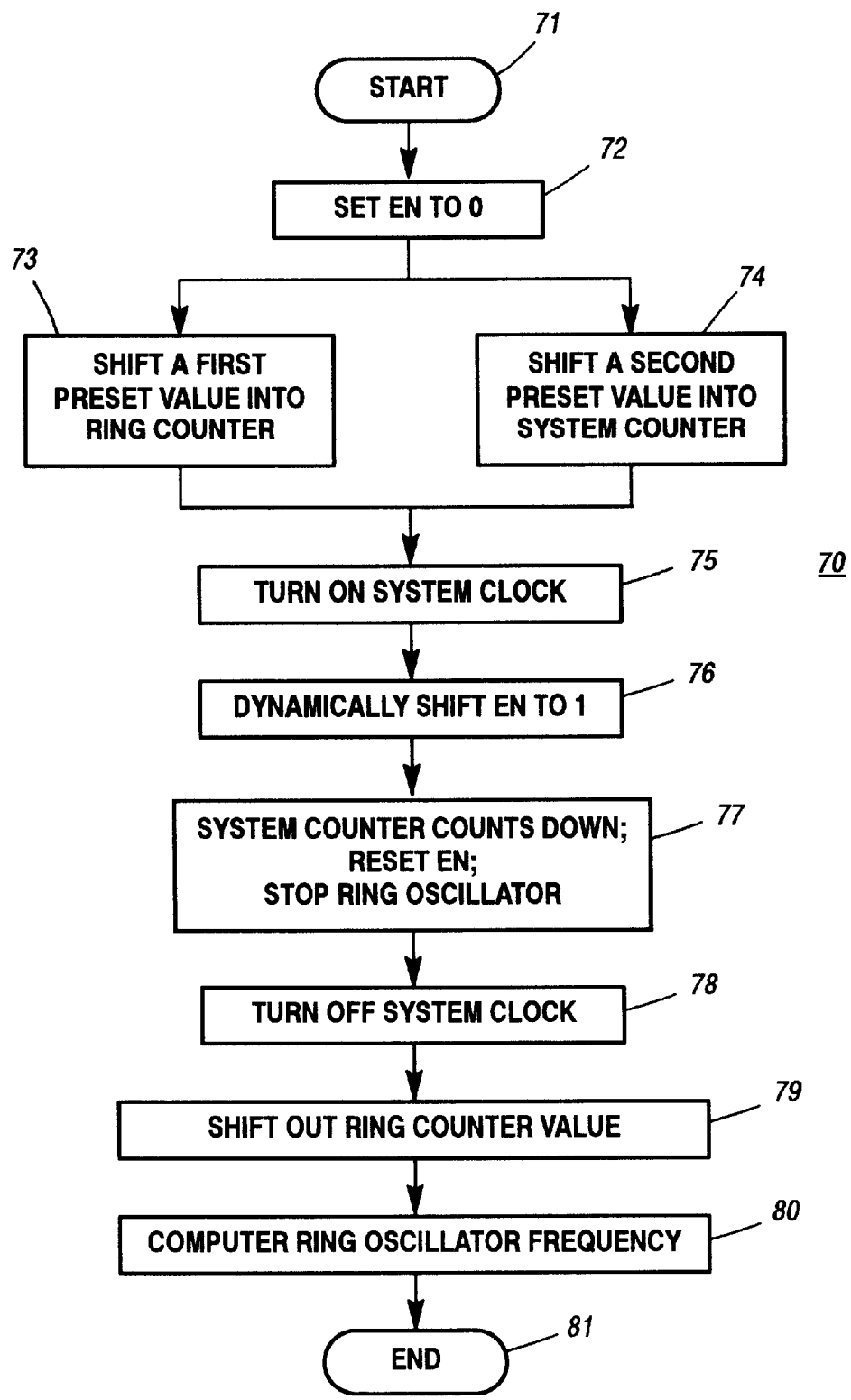
FIG. 7 is a method of the invention for measuring speed (frequency) of a ring oscillator formed on a chip in accordance with an aspect of the invention.

Referring to FIG. 7, there is shown a method of determining speed (frequency) of a ring oscillator on an ASIC or other chip. The method, generally designated as 70, starts in step 71 and proceeds to set the enable (EN) circuit (for example EN 18 in FIG. 1) to a 0 value. A first preset value is shifted (step 73) into the ring counter residing on the chip (for example ring counter 17). A second preset value is shifted (step 74) into the system counter residing on the chip (for example system counter 21). These values may be statically shifted into the counters, for example, by using maintenance test set 44 of FIG. 4.

Step 75 turns on the system clock and the enable circuit is dynamically shifted to a 1 value in step 76. The system clock may be a clock signal generated by maintenance test set 44 and may be set to a predetermined frequency.

The system counter begins to count down in response to system clock pulses (step 77). When detecting a predetermined count value (for example a value of 1), step 77 resets the enable circuit. The ring oscillator is stopped and the ring counter, in turn, stops counting down because the ring clock pulses have stopped.

Step 78 turns off the system clock. Next, in step 79, the ring counter value may be statically shifted out from the register of the ring counter. The ring oscillator frequency may next be computed (step 80) using the equation described previously. The method ends in step 81.

Figure 8:
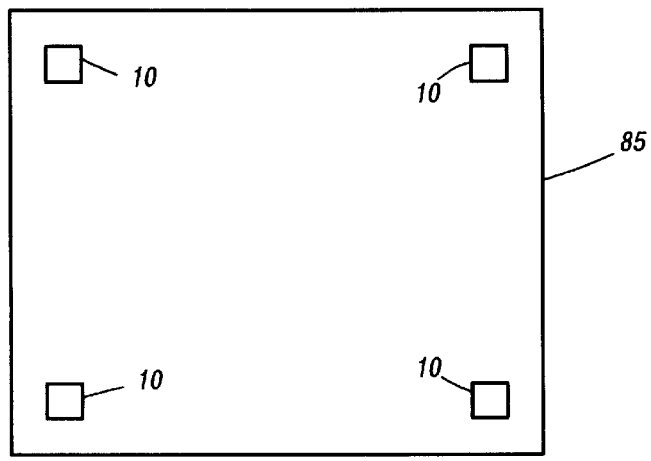
FIG. 8 is an illustration (not to scale) of a chip having formed therein multiple systems for measuring the speed (frequency) of a ring oscillator.
Figure 9:
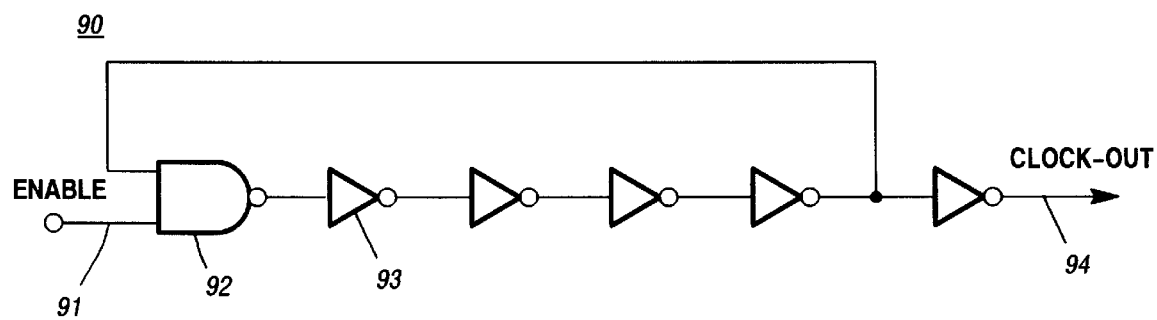
FIG. 9 is a conventional ring oscillator providing a clock output signal including periodic pulses.

FIG. 8 is an exemplary embodiment of chip 85 which may be an ASIC. Logic circuits may be formed on chip 85 using a hardware description language (HDL). The HDL may be synthesized into logic gates and may be automatically arranged in a layout to form the ASIC's physical design. In the example shown, four systems 10, each measuring speed (frequency) of a ring oscillator, are formed at respective corners of the chip.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A system of determining oscillation frequency of a ring oscillator formed on a chip, the system comprising:
   a ring oscillator formed on the chip for providing a ring clock signal having first periodic pulses,
   a ring counter formed on the chip for providing a ring clock count value in response to the first periodic pulses,
   a terminal for receiving a system clock signal having second periodic pulses, and
   a system counter formed on the chip for providing a system clock count value in response to the second periodic pulses,
   wherein the oscillation frequency of the ring oscillator is determined based on the ring clock count value and the system clock count value.

2. The system of claim 1 wherein the system clock signal includes a predetermined frequency, and
   the oscillation frequency of the ring oscillator is determined based on a product of (a) the predetermined frequency and (b) a ratio of the ring clock count value and the system clock count value.

3. The system of claim 1 including
   an enable circuit formed on the chip for concurrently enabling the ring oscillator and the system counter.

4. The system of claim 3 including
   a count detector coupled between the system counter and the enable circuit for detecting a predetermined system clock count value and providing a reset command to the enable circuit in response to the detection of the predetermined system clock count value.

5. The system of claim 4 wherein the enable circuit includes a D-type flip flop having a D-pin, a CLK-pin and a Q-pin; and
   the D-pin is coupled to the count detector for receiving the reset command,
   the CLK-pin is coupled to the system clock signal, and
   the Q-pin is coupled to the ring oscillator and the system counter for providing an enable signal to concurrently enable the ring oscillator and the system counter.

6. The system of claim 1 wherein
   the ring counter includes a first register for storing a first preset value, and the system counter includes a second register for storing a second preset value,
   the ring counter is configured to countdown from the first preset value in response to the first periodic pulses, and
   the system counter is configured to countdown from the second preset value in response to the second periodic pulses.

7. The system of claim 6 wherein
   the second register is a N-bit register and the second preset value is N-bits wide, and
   the first register is a (N+x)-bit register and the second preset value is (N+x)-bits wide,
   wherein x is an integer value of one of 1, 2 and 3.

8. The system of claim 6 including
   a maintenance test set for statically shifting into the first register the first preset value and shifting into the second register the second preset value.

9. The system of claim 8 wherein
   the first register is configured to count down to a first ring clock count value, and
   the maintenance test set is configured to statically shift out from the first register the first ring clock count value.

10. The system of claim 9 wherein
    the system clock signal includes a predetermined frequency,
    the second register is configured to count down to a system clock count value of zero and stop counting, and
    the oscillation frequency of the ring oscillator is determined based on a product of (a) the predetermined frequency and (b) a ratio formed by the ring clock count value and the system clock count value,
    in which the system clock count value is the second preset value, and the ring clock count value is a difference between the first preset value and the first ring clock count value.

11. The system of claim 10 wherein
the ring oscillator, the ring counter and the system counter are formed in an application specific integrated circuit (ASIC).

12. In a chip having a ring oscillator and a terminal for receiving a system clock, a method of determining oscillation frequency of the ring oscillator comprising the steps of:
   (a) disabling the ring oscillator and the system clock;
   (b) respectively applying a ring counter to the ring oscillator and a system counter to the system clock;
   (c) enabling the system clock;
   (d) concurrently enabling the ring oscillator and the system counter in response to said enabling step (c);
   (e) counting in the ring counter pulses of the ring oscillator and counting in the system counter pulses of the system clock; and
   (f) determining the oscillation frequency of the ring oscillator in response to said counting step (e).

13. The method of claim 12 further including
   (g) statically shifting into the ring counter a first preset value and shifting into the system counter a second preset value, prior to said enabling step (c); and
   step (e) includes counting down in the ring counter from the first preset value and counting down in the system counter from the second preset value.

14. The method of claim 13 in which step (e) includes stopping the counting down by the ring counter from the first preset value to a countdown value, after counting down by the system counter from the second preset value to a predetermined stop count value.

15. The method of claim 14 further including
   (h) statically shifting out from the ring counter the countdown value after stopping the counting down by the ring counter.

16. The method of claim 15 in which the system clock includes a predetermined clock frequency, and
   step (f) includes determining the oscillation frequency by forming a product of (1) the predetermined system clock frequency and (2) the difference between the first preset value and the countdown value of the ring counter and (3) the inverse of the second preset value shifted into the system counter.

17. The method of claim 12 in which
   step (b) includes forming the ring counter and the system counter on the same chip having the ring oscillator formed therein.

18. The method of claim 17 in which step (c) includes enabling the system clock by a maintenance test set coupled to the chip.

19. The method of claim 12 in which the system clock includes a predetermined clock frequency, and
   step (e) includes counting in the ring counter pulses of the ring oscillator to obtain a ring clock count value and counting in the system counter pulses of the system clock to obtain a system clock count value, and
   step (f) includes determining the oscillation frequency of the ring oscillator based on a product of (a) the predetermined frequency and (b) a ratio of the ring clock count value and the system clock count value.

* * * * *